United States Patent
Devanie et al.

(10) Patent No.: US 7,019,403 B2
(45) Date of Patent: Mar. 28, 2006

(54) ADHESIVE FILM AND TACKING PADS FOR PRINTED WIRING ASSEMBLIES

(75) Inventors: Katherine M. Devanie, Arlington Heights, IL (US); Lane V. Brown, Spring Grove, IL (US); Michael L. Johnson, Carol Stream, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/652,136

(22) Filed: Aug. 29, 2003

(65) Prior Publication Data

US 2005/0046026 A1 Mar. 3, 2005

(51) Int. Cl.
*H01L 23/48* (2006.01)
*H05K 7/10* (2006.01)

(52) U.S. Cl. .................. 257/772; 257/783; 257/786; 361/767; 361/771

(58) Field of Classification Search .............. 257/738, 257/772, 773, 778, 779, 780, 782, 783, 786; 228/180.22; 29/840; 438/118
See application file for complete search history.

(56) References Cited

U.S. PATENT DOCUMENTS

| | | | | |
|---|---|---|---|---|
| 4,764,804 A | * | 8/1988 | Sahara et al. ............... | 257/717 |
| 5,186,383 A | * | 2/1993 | Melton et al. ......... | 228/180.22 |
| 5,269,453 A | * | 12/1993 | Melton et al. ......... | 228/180.22 |
| 5,400,950 A | * | 3/1995 | Myers et al. .......... | 228/180.22 |
| 5,773,882 A | * | 6/1998 | Iwasaki ..................... | 257/692 |
| 5,920,125 A | * | 7/1999 | Ellerson et al. ............. | 257/778 |
| 5,953,814 A | * | 9/1999 | Sozansky et al. ............. | 29/840 |
| 6,204,163 B1 | * | 3/2001 | Panchou et al. ............ | 438/613 |
| 6,242,815 B1 | * | 6/2001 | Hsu et al. ................... | 257/786 |
| 6,426,566 B1 | * | 7/2002 | Sawamoto .................. | 257/783 |
| 6,642,626 B1 | * | 11/2003 | Park .......................... | 257/778 |
| 6,773,957 B1 | * | 8/2004 | Farnworth et al. .......... | 438/107 |
| 6,815,830 B1 | * | 11/2004 | Miyasaka ................... | 257/778 |
| 2002/0061968 A1 | * | 5/2002 | Yoshihara et al. .......... | 525/100 |
| 2004/0004292 A1 | * | 1/2004 | Hsieh et al. ................ | 257/778 |

* cited by examiner

*Primary Examiner*—Alonzo Chambliss

(57) ABSTRACT

A self supported underfill film adhesively bonds surface mount integrated circuit packages to a printed circuit board. The printed circuit board has conductive traces and exposed conductive pads on the surface. Solder paste is printed on the conductive pads, and one or more additional solder paste deposits are printed in an area outside the conductive pads to serve as tack pads for a film adhesive. The film adhesive is strategically positioned on the printed circuit board over the tack pads and near the conductive pads, and the surface mount integrated circuit package is then placed on the board so that the conductive pads on the package align with the conductive pads on the board. The film adhesive softens when the package is soldered to the board, and the film ultimately serves as an underfill to increase the mechanical integrity of the solder joints.

14 Claims, 3 Drawing Sheets

ADHESIVE FILM AND TACKING PADS FOR PRINTED WIRING ASSEMBLIES

This invention was made with United States Government support under Agreement No. 70NANB8H4007 awarded by the National Institute of Standards and Technology (NIST). The United States Government has certain rights in the invention.

FIELD OF THE INVENTION

This invention relates generally to printed wiring assemblies. More particularly, this invention relates to the use of underfill adhesives to bond surface mount integrated circuit packages to printed circuit boards.

BACKGROUND

Integrated circuit (IC) packages such as Flip Chip (FC) and Ball Grid Array (BGA) packages are directly attached to printed circuit boards (PCB) by means of surface mount solder joints. This technology is widely used today in electronic items from computers to cellular telephones to produce very efficient, high-density products.

However, when these packages are mounted on printed circuit boards, mechanical stresses transmitted to the solder joints can cause the interconnect system to fail by any number of mechanisms, such as cracking of the solder joint or circuit trace, or a solder pad may delaminate from the PCB. These mechanical stresses can arise from a number of sources, such as thermal mismatch between the package and the PCB, but most commonly are caused by mechanical shock when the electronic product is dropped. One common solution to this problem has been known for some time. Specifically, a liquid polymerizable material, called an "underfill", is flowed under the package after it is soldered to the PCB. Once the underfill has completely filled the small gap that exists between the bottom of the flip chip and the substrate, the material is hardened by polymerization. The hardened, polymerized underfill locks the IC package and the PCB together so that there is little if any differential movement. By controlling excessive stresses that would otherwise form in the joints between the chip and PCB, a reliable assembly can be fabricated.

While the conventional use of underfill has solved the mechanical shock problem on PCBs, it has given rise to a series of significant manufacturing problems. First, the pre-polymerized liquid underfill must be applied as a secondary process with special equipment. Typically, the underfill is applied to one, two or three edges of the assembled package and allowed to flow all the way under the mounted package. Once the material has flowed to opposite edges and all air has been displaced from under the chip, additional underfill may be dispensed to those outer edges to form a fillet. The fillet increases reliability and is generally preferred even though it requires additional manufacturing time. Next the assembly is baked in an oven to polymerize and harden the underfill, again adding time to the process. Thus, while the use of underfill helps to alleviate the mechanical shock problem and provides a commercial solution, the electronic device manufacturing industry seeks more efficient manufacturing methods that reduce the number of process steps required with underfill application.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
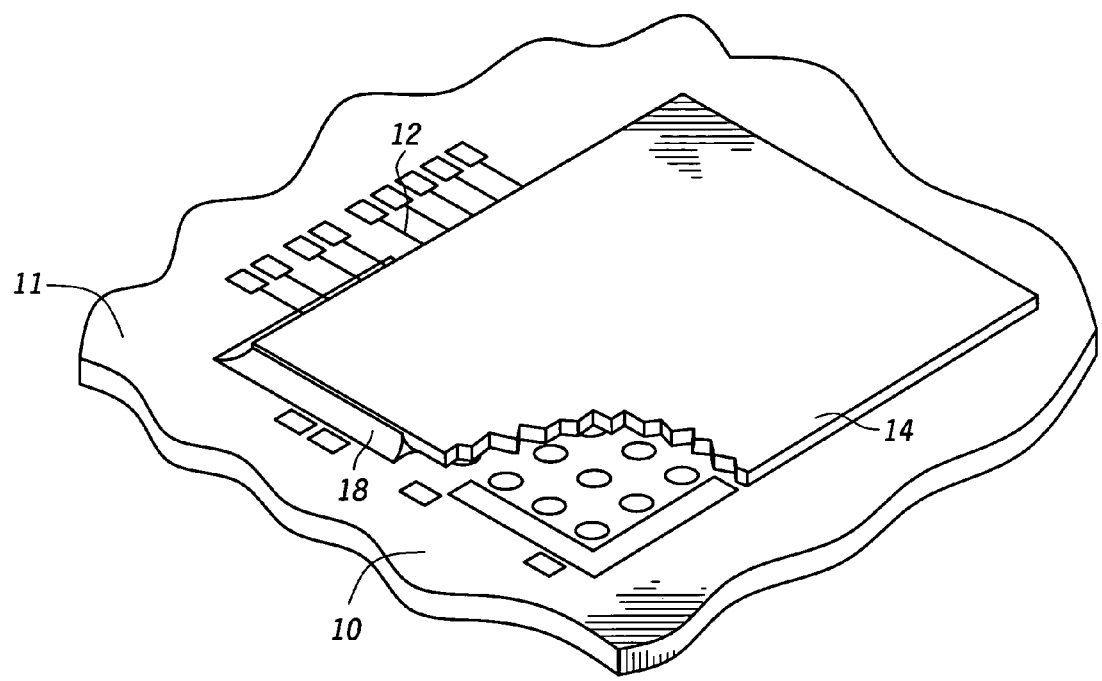
FIG. 1 is a cut-away isometric view of a surface mount integrated circuit package mounted on a printed circuit board in accordance with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

A self supported underfill film adhesively bonds a surface mount integrated circuit package to a printed circuit board (PCB). The printed circuit board has exposed conductive pads on the surface. Solder paste is printed on the exposed conductive pads along with additional deposits on the surface of the PCB near the conductive pads. The flux in the solder paste renders it somewhat sticky, and when the underfill film adhesive is strategically positioned on the printed circuit board over the paste deposits that are not on the conductive pads, the sticky solder paste retains the film adhesive to keep it in position. The surface mount integrated circuit package is then placed on the board so that the conductive pads on the package align with the solder paste on the conductive pads on the board. The assembly is heated to reflow the solder, softening the film adhesive to bond the package to the PCB and increase the mechanical integrity of the solder joints.

Figure 2:
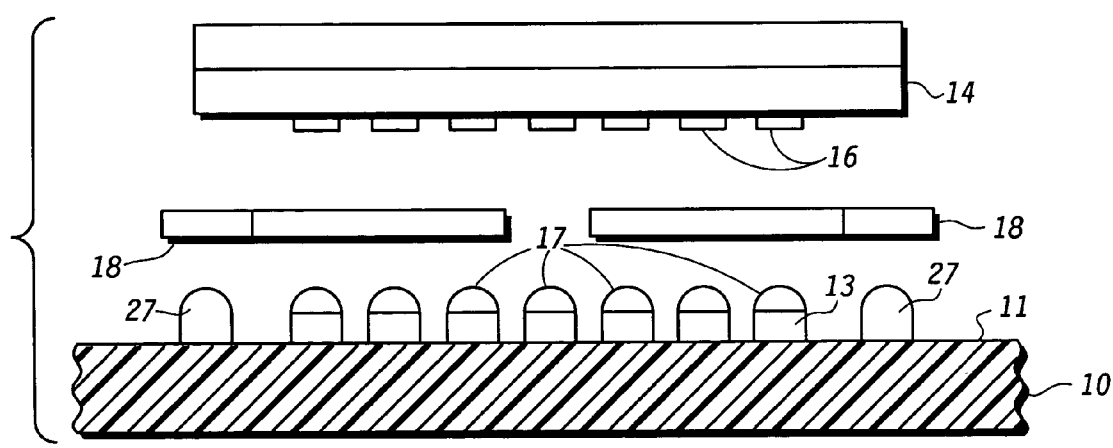
FIG. 2 is an exploded side view of a surface mount integrated circuit package, a film adhesive, and tack pads used to attach the film and package to a printed circuit board in accordance with certain embodiments of the present invention.
Figure 3:
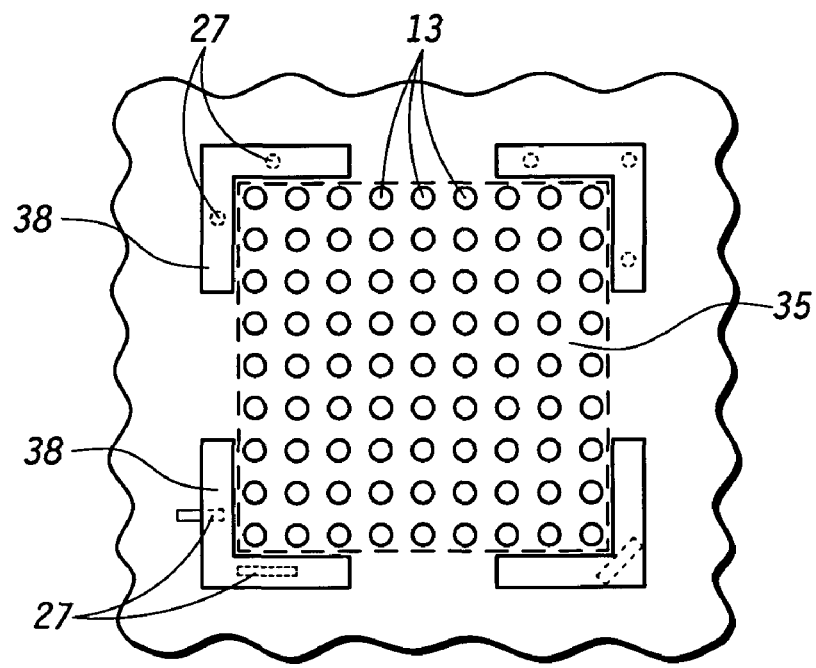
FIGS. 3 and 4 are partial plan views of a printed circuit board with underfill film deposited over tacking pads to depict the positioning of the film in accordance with various embodiments of the present invention.
Figure 5:
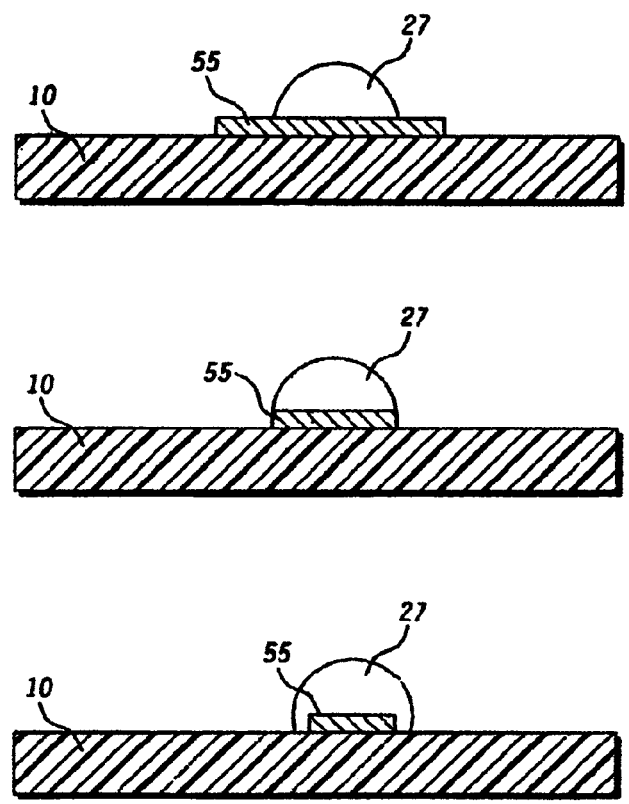
FIG. 5 is a partial cross-sectional view of a printed circuit board depicting various embodiments of tacking pads on metal pads in accordance with certain embodiments of the present invention.

Referring now to FIGS. 1 and 2, a printed circuit board 10 designed for surface mount components has conductive traces 12 on at least one major surface or side 11, in conventional manner. The PCB 10 also has a plurality of conductive metal pads 13 disposed on that side and connected to at least some of the conductive traces 12, typically arranged in a pattern, such as an array, and situated to receive a surface mount integrated circuit package 14. These pads are generally referred to as I/O (input/output) pads and define an integrated circuit package receiving area. This receiving area 35 is shown in FIG. 3 as the portion inside the dashed lines. The conductive pads 13 are typically exposed so as to enable electrical connection between the IC package 14 and the traces 12 on the PCB. The IC package, such as a ball grid array, a flip chip package, or other type of area array surface mount package, typically has an array of contacts or terminals 16 on the underside of the package, that are connected to a silicon chip inside the package in conventional fashion as is well known to those of ordinary skill in the art. These contacts 16 are intended to be reflow soldered to the corresponding conductive pads 13 on the PCB. This is accomplished by printing, stenciling, or otherwise depositing solder paste 17 on the pads 13. During this step, tack pads 27 are formed by making additional deposits of solder paste directly onto the PCB at one or more locations surrounding the receiving region 35. These tack pads 27 are not part of the array of I/O pads and do not function as an electrical connection to route signals. For example, in one embodiment the tack pads are formed directly on the dielectric surface of the PCB, either on the solder resist or in an opening in the resist. FIG. 5 shows other embodiments where the solder deposits that form the tack pads 27 can also be placed on one or more metal pads 55, depending on the wishes of the layout designer, but in no case would the solder on the tack pad serve as an electrical connection for routing signals. The underlying metal pad 55 can be smaller than the solder deposit 27, approximately the same size as the solder deposit, or larger than the solder deposit, depending on the performance desired. A self supporting film adhesive 18 that has been cut to a certain shape is then placed on the PCB near, but not touching, the conductive pads 13 so that it covers one or more of the tack pads 27. The tack pads 27 serve to mildly adhere the adhesive film 18 to the paste deposit to hold it in place. This is important in situations where the film is being positioned by a robot or other high speed placement machine. Typically on these systems, the pick up nozzle or tip on the placement machine picks up the film adhesive from a bin or reel using vacuum through the tip, moves to the appropriate placement location, and moves down to the PCB surface to deposit the film in place. The vacuum is then vented to reach ambient pressure, releasing the film. Positive air pressure is then ported to the nozzle to insure that the film releases from the tip when the tip is retracted. However, in many cases this sequence of vacuum/vent/pressurize is problematical and the reliability of placing films is not as high as it should be, because the film either stays with the nozzle or the film placement position is altered by the air pulse. Our invention incorporates a solder paste deposit within the film footprint to provide sufficient tack to pull the film away from the nozzle as the air pulse is activated and the nozzle pulls away from the substrate. The tack pad contacts the underside of the film adhesive during placement to aid in releasing it from the nozzle. Since the solder paste is deposited as part of the solder printing process (by, for example, providing additional openings in the solder paste stencil), no additional process steps or costs are required. The integrated circuit package 14 is then placed into the receiving region 35 so that the terminals 16 on the underside of the package are aligned with respective conductive I/O pads 13, to enable the deposited solder paste 17 to be reflowed to form a mechanical and electrical connection to the package. During the solder reflow step, the solder paste melts and simultaneously the underfill adhesive film 18 softens and flows to form a fillet around the outside edge of the IC package as is shown in FIG. 1. The degree of softening and flow depends, of course, on the characteristics of the adhesive selected for the underfill film. For example, a thermoplastic adhesive will soften and flow during the soldering step, and then harden upon cooling to room temperature. Thermoset adhesives, such as epoxies, polyesters, polyurethanes, and polyimides will experience little or no softening, and generally flow less than thermoplastics, and may or may not create a small fillet prior to curing to a rigid solid. In either case, upon cooling, the adhesives harden to lock the IC package securely in place and prevent differential movement during subsequent mechanical shocks that may occur in the life cycle of the electronic product. The adhesive film 18 functions as an underfill between the IC package 14 and the PCB 10 and serves to rigidize the assembly once the package is soldered to the PCB. Referring now to FIG. 3, in one embodiment the adhesive film 38 is cut in a shape of the letter "L" and strategically placed at each of the four corners of the array of conductive pads. The adhesive film is carefully positioned so that it is close to the individual conductive pads, but not touching the pads, so as to not interfere with soldering of the IC package to the PCB. Unlike the prior art that predispenses underfill on the IC package, our invention utilizes a self supporting film of adhesive that is placed onto the PCB and the tack pads immediately prior to the time that the IC package is placed on the PCB. Because the underfill adhesive is in the form of a self supporting film, it can be pre-packaged in, for example, tape and reel format so as to be easily manipulated by placement machines or robots just like any other electronic component. The space between the "L" shaped films provides openings in the middle along each side of the package perimeter to permit volatile gases generated in the soldering operation to escape from underneath the package. These openings also provide for faster soldering by increasing convective heat under the IC package. Tack pads 27 can be placed in a variety of shapes and patterns, and it is intended that the present invention embrace all such alternatives, modifications and variations as fall within the scope of the appended claims. For example, circles, squares, rectangle, ovals, and other polygons, regular and irregular, can be employed, depending on the degree of tack needed to retain the film adhesive in place during the placement process. The tack pad does not need to be entirely contained under the adhesive film.

Figure 4:
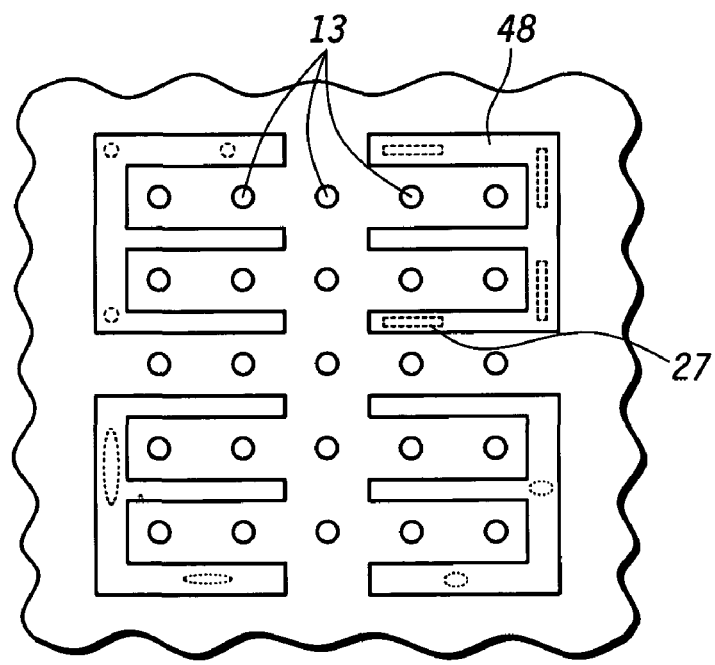

An alternate embodiment of our invention is shown in FIG. 4 where the self supporting underfill adhesive film 48 is in the form of a mesh or grid pattern, surrounding individual solder pads 13 or groups of pads on the PCB array. Tack pads 27 can also be placed within the boundary of the array of I/O pads, as long as they do not provide electrical function and are ultimately covered by the film adhesive.

The self supporting adhesive underfill film 18 can be pure polymer, or it can be filled with a filler to alter the physical properties of the adhesive. For example, numerous inorganic fillers such as silica, titanium dioxide, carbon fibers, microballoons, etc. are well known to those skilled in the art and can be easily added to the film, along with organic dyes. This is advantageous because it reduces the inherent flexibility of the film, making it easier to handle in an automated factory. Laminated films can also be used, with a stiffener laminated longitudinally as, for example, the center core between two layers of adhesive film. Stiffeners such as metal foils, glass fiber mats, paper sheets, or a layer of fully cured thermoset polymer, etc. can be laminated to the adhesive film.

In summary, and without intending to limit the scope of the invention, a novel method of placing a self supporting film of underfill adhesive for surface mounted IC packages on printed circuit boards utilizes one or more tacking pads of solder paste printed on the PCB prior to placing the film. The tack pads provide sufficient tack to reliably pull the film away from the placement nozzle. The film is then cured or softened during the solder reflow step to encapsulate the solder tack pad and bond the IC package to the PCB, preventing stresses from mechanical shock to be concentrated at the solder joints. While the invention has been described in conjunction with specific embodiments, it is evident that many alternatives, modifications, permutations and variations will become apparent to those of ordinary skill in the art in light of the foregoing description. For example, although the adhesive film has been shown in an "L" shape and an "E" shape, it can of course assume a variety of other shapes and configurations. Accordingly, it is intended that the present invention embrace all such alternatives, modifications and variations as fall within the scope of the appended claims.

What is claimed is:

1. A printed wiring assembly, comprising:
   a printed circuit board, having on a major surface thereof a plurality of I/O pads situated within an integrated circuit package receiving region, and having thereon at least one solder deposit that is not a part of the plurality of I/O pads;
   a surface mount integrated circuit package soldered to the I/O pads at the receiving region; and
   a film adhesive situated on the printed circuit board and covering the solder deposit and a portion of the major surface, adhesively bonding the surface mount integrated circuit package to the printed circuit board, wherein the film adhesive does not extend completely around the package perimeter.

2. The printed wiring assembly as described in claim 1, wherein the film adhesive is 'L-shaped'.

3. The printed wiring assembly as described in claim 1, wherein the film adhesive is an open mesh grid.

4. The printed wiring assembly as described in claim 1, wherein a portion of the film adhesive extends beyond a perimeter of the package.

5. The printed wiring assembly as described in claim 1, wherein the film adhesive does not contact the plurality of I/O pads.

6. The printed wiring assembly as described in claim 1, wherein the film adhesive contains one or more additives selected from the group consisting of an inorganic filler, a dye, a pigment, and a stiffening layer.

7. The printed wiring assembly as described in claim 1, wherein the film adhesive is a thermoset adhesive.

8. The printed wiring assembly as described in claim 1, wherein the film adhesive is a thermoplastic adhesive.

9. The printed wiring assembly as described in claim 1, wherein the film adhesive is softened by electromagnetic energy.

10. A printed wiring assembly, comprising:
    a printed circuit board, having on a major surface thereof a plurality of I/O pads situated within an integrated circuit package receiving region, and having thereon at least one solder deposit that is not a part of the plurality of I/O pads;
    a surface mount integrated circuit package soldered to the I/O pads at the receiving region; and
    a film adhesive situated on the printed circuit board and covering the solder deposit and a portion of the major surface, adhesively bonding the surface mount integrated circuit package to the printed circuit board, wherein the film adhesive is applied as a free film to the printed circuit board major surface prior to soldering the surface mount integrated circuit package to the I/O pads.

11. A printed wiring assembly, comprising:
    a printed circuit board, having on a major surface thereof a plurality of I/O pads situated within an integrated circuit package receiving region, and having thereon at least one solder deposit that is not a part of the plurality of I/O pads;
    a surface mount integrated circuit package soldered to the I/O pads at the receiving region;
    a film adhesive situated on the printed circuit board and covering the solder deposit and a portion of the major surface, adhesively bonding the integrated circuit package to the printed circuit board;
    wherein the film adhesive is applied as a free film to the printed circuit board major surface prior to soldering the surface mount integrated circuit package to the I/O pads;
    wherein the film adhesive does not extend completely around the package perimeter; and
    wherein the film adhesive does not contact the plurality of I/O pads.

12. A printed wiring assembly, comprising:
    a printed circuit board, having on a major surface thereof an array of solderable pads situated within an integrated circuit package receiving region, and having thereon one or more tack pads distinct from the array of solderable pads;
    solder deposited on the array of solderable pads and on the one or more tack pads;
    a film adhesive situated on the printed circuit board, covering at least a portion of the solder on the one or more tack pads and covering a portion of the major surface, wherein the film adhesive does not extend completely around the package perimeter; and
    a surface mount integrated circuit package soldered to the array of solderable pads and adhesively bonded to the printed circuit board by the film adhesive.

13. The printed wiring assembly as described in claim 12, wherein the one or more tack pads are metal.

14. The printed wiring assembly as described in claim 12, wherein the one or more tack pads are non-metallic.

* * * * *